(12) United States Patent
Wang et al.

(10) Patent No.: US 10,020,198 B1
(45) Date of Patent: Jul. 10, 2018

(54) SEMICONDUCTOR STRUCTURE HAVING LOW-K SPACER AND METHOD OF MANUFACTURING THE SAME

(71) Applicant: TAIWAN SEMICONDUCTOR MANUFACTURING COMPANY LTD., Hsinchu (TW)

(72) Inventors: Shiang-Bau Wang, Taoyuan County (TW); Victor Y. Lu, Foster City, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/380,329

(22) Filed: Dec. 15, 2016

(51) Int. Cl.
| H01L 21/44 | (2006.01) |
| H01L 21/28 | (2006.01) |
| H01L 29/78 | (2006.01) |
| H01L 29/66 | (2006.01) |
| H01L 29/08 | (2006.01) |

(52) U.S. Cl.
CPC .... *H01L 21/28132* (2013.01); *H01L 29/0847* (2013.01); *H01L 29/6653* (2013.01); *H01L 29/6656* (2013.01); *H01L 29/66795* (2013.01); *H01L 29/66803* (2013.01); *H01L 29/785* (2013.01)

(58) Field of Classification Search
None
See application file for complete search history.

(56) References Cited

U.S. PATENT DOCUMENTS

| 8,487,378 | B2 | 7/2013 | Goto et al. |
| 8,729,634 | B2 | 5/2014 | Shen et al. |
| 8,826,213 | B1 | 9/2014 | Ho et al. |
| 8,887,106 | B2 | 11/2014 | Ho et al. |
| 9,269,714 | B2 * | 2/2016 | Flachowsky ......... H01L 27/092 |
| 9,368,603 | B2 * | 6/2016 | Chuang ............. H01L 21/28088 |
| 9,530,696 | B1 * | 12/2016 | Liu ................. H01L 21/823431 |
| 9,548,366 | B1 * | 1/2017 | Ho ..................... H01L 29/66545 |
| 2004/0253787 | A1 * | 12/2004 | Lee ..................... G11C 16/0458 438/257 |
| 2010/0048024 | A1 * | 2/2010 | Sugimura ........... H01L 21/0337 438/702 |
| 2014/0001474 | A1 * | 1/2014 | Hong .................. H01L 21/8238 257/57 |

(Continued)

*Primary Examiner* — Thao P Le
(74) *Attorney, Agent, or Firm* — WPAT, P.C., Intellectual Property Attorneys; Anthony King

(57) ABSTRACT

The present disclosure provides a semiconductor structure, including a semiconductor fin, a metal gate over the semiconductor fin, and a sidewall spacer composed of low-k dielectric surrounding opposing sidewalls of the metal gate. A portion of the sidewall spacer comprises a tapered profile with a greater separation of the opposing sidewalls toward a top portion and a narrower separation of the opposing sidewalls toward a bottom portion of the sidewall spacer. The present disclosure also provides a method of manufacturing a semiconductor device. The method includes forming a polysilicon stripe over a semiconductor fin, forming a nitride sidewall spacer surrounding a long side of the polysilicon stripe, forming a raised source/drain region in the semiconductor fin, and forming a carbonitride etch stop layer surrounding the nitride sidewall spacer.

18 Claims, 17 Drawing Sheets

(56) References Cited

U.S. PATENT DOCUMENTS

| | | | |
|---|---|---|---|
| 2014/0282326 A1 | 9/2014 | Chen et al. | |
| 2014/0361335 A1* | 12/2014 | Flachowsky | H01L 27/092 257/190 |
| 2014/0361352 A1* | 12/2014 | Hung | H01L 21/28008 257/288 |
| 2015/0145027 A1* | 5/2015 | Lin | H01L 29/66545 257/330 |
| 2015/0348966 A1* | 12/2015 | Zhao | H01L 27/0886 257/401 |
| 2016/0111515 A1* | 4/2016 | Besser | H01L 29/4991 257/401 |
| 2016/0172378 A1* | 6/2016 | Chou | H01L 27/1211 257/347 |
| 2017/0004997 A1* | 1/2017 | Lu | H01L 21/76897 |
| 2017/0117380 A1* | 4/2017 | Lu | H01L 29/6656 |

* cited by examiner

SEMICONDUCTOR STRUCTURE HAVING LOW-K SPACER AND METHOD OF MANUFACTURING THE SAME

FIELD

The present disclosure relates to the structure and manufacturing method of a low-k spacer of a FinFET metal gate.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Increasing precision in device manufacturing is required because of the constantly increasing density of semiconductor devices in integrated circuit manufacturing. The ability to control the gate length in field effect transistors (EFTS) is of importance. Without the ability to shorten gate length, an increase in density and circuit performance could not be accomplished. Also, because of the reduced gate lengths, there is a need for an improved process that reduces the junction capacitance between the source/drain extension lateral overlap and the gate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
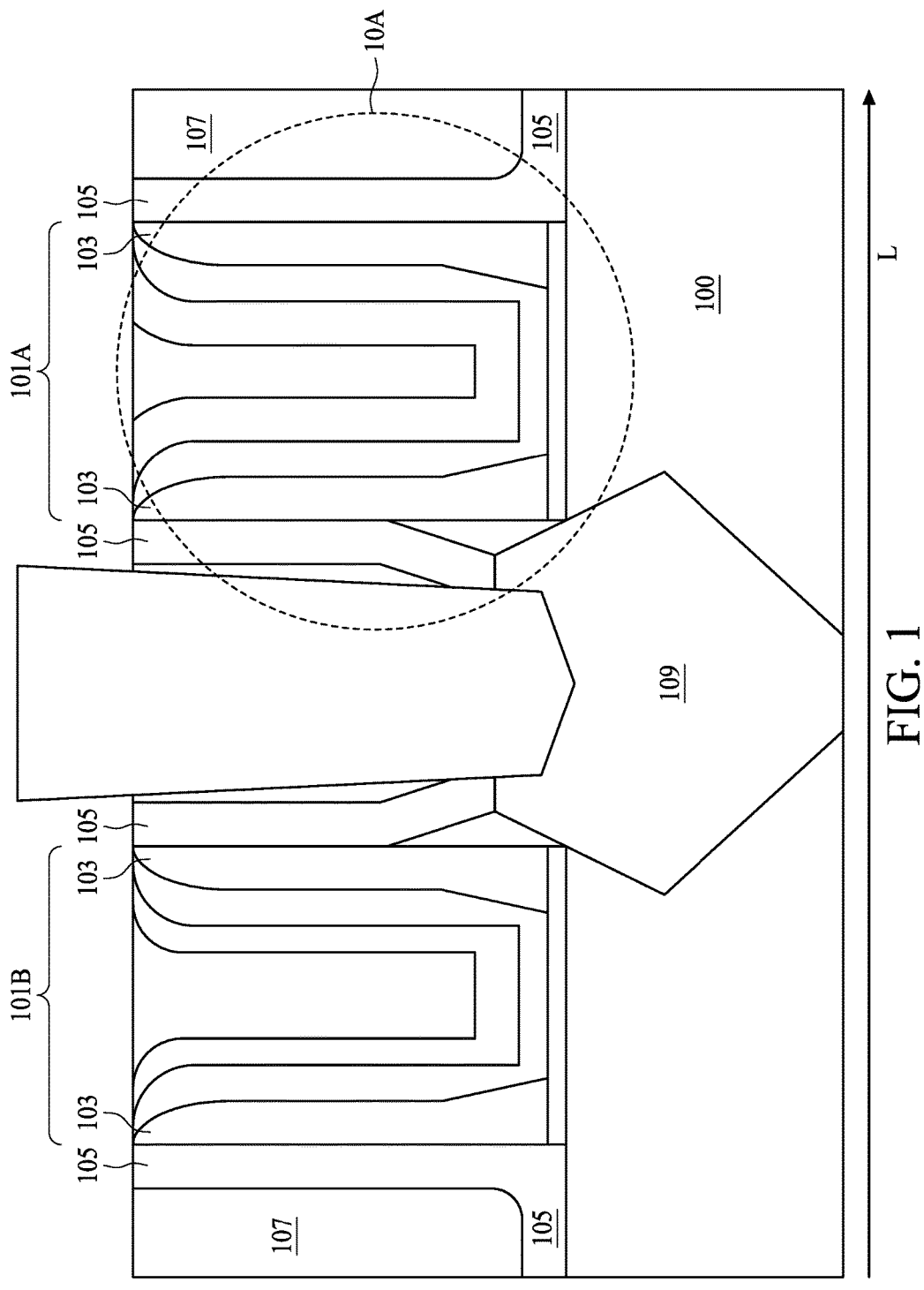
FIG. 1 is a cross sectional view of a semiconductor structure, in accordance with some embodiments of the present disclosure.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A typical transistor generally includes a gate electrode formed near a semiconductor substrate to control the flow of current from a source to a drain of the transistor and metal contacts which facilitate the flow of electrical current to and from source and drain regions of the transistor. Sidewall spacers formed proximate the gate electrode are used as implant blockers and as well as to prevent the components of the transistor from shorting during various stages of the manufacturing process of the transistor. The sidewall spacers create an undesired capacitance between the metal contacts and the gate electrode. Furthermore, as the components of the transistor decrease in size, this capacitance between the gate electrode and the contacts gets larger. This gate-to-contact capacitance constitutes approximately ten to fifteen percent of the overall capacitance of the transistor (or the capacitance between the gate electrode and the drain or between the gate electrode and the source). The higher the overall capacitance, the greater the adverse effect on the operation of the transistor. For example, the higher the overall capacitance, the slower the switching speed of the transistor.

The low-k spacer presented herein could reduce junction capacitance between the source/drain extension lateral overlap and the gate because the low k spacer overlies the S/D extension (e.g., LDD). The low k spacer has a lower dielectric constant and thus RC is lowered because Capacitance is lowered. This is important and a benefit because the device has faster signal propagation and larger drive current.

In addition, the manufacturing method of the low-k spacer allows the low-k spacer in final product to be free from material damages resulted in various implantation and photolithography operations.

Implantation operations, such as lightly doped drain (LDD), entail high energy ion bombardment to the substrate. Due to the fact that the ion bombardment does not occur in perfectly vertical direction, some of the ion bombardment trajectory would encounter the low-k sidewall spacer, rendering a damaged surface of said low-k sidewall spacer.

On the other hand, after the LDD implantation, photolithography operations such as ashing and fluoride-containing wet etching may be conducted to remove and descum photoresist used as a soft mask in the previous implantation operation. The damaged surface of low-k sidewall spacer can easily be oxidized in the ashing operation and then structurally removed through the fluoride-containing wet etching descum. For example, if the low-k sidewall spacer is carbon-containing dielectric such as SiOCN, the ashing operation can turns the reactants into $CO_2$ and SiON. Oxynitride could then be easily removed by the fluoride-containing wet etchant, such as diluted hydrofluoride (DHF). Since the surface of the low-k sidewall spacer is damaged and subsequently removed through the implantation and photolithography operations, the thickness of the low-k sidewall spacer changes substantially. The change of sidewall spacer thickness, in other words, the change of critical dimension of the gate, generates impacts on the following source/drain recess formation. One of the major issues is that the proximity of the source/drain recess formation could be different from the one that designed according to the original sidewall spacer thickness. Proximity of a regrown source/drain structure is controlled by the critical dimension of the gate. Once the critical dimension drifts along the manufacturing operations, the proximity changes and deteriorates the production uniformity and device performance.

Other manufacturing operations in a replacement gate FET structure, such as the removal of polysilicon stripes and formation of a metal gate trench, the aforesaid photolithography operation is carried out to complete the removal operation. As previously discussed, the ashing and wet cleaning sequences could influence the thickness of the low-k sidewall spacer, rendering an impact on the metal gate critical dimension control. Since different volume of the metal is filled into the metal gate trench due to lack of critical dimension control, the switching speed of the replacement gate FET cannot be assured to meet the specification and achieve desired performance uniformity.

Moreover, when the device size shrinks in a replacement gate FET, the gate filling metal is inclined to generate voids due to narrower trench opening and increased aspect ratio of the trench. A wider trench opening is thus desired to overcome such gate filling difficulties in reduced scale.

Present disclosure provides a semiconductor structure having a low-k sidewall spacer. The critical dimension of the metal gate of the semiconductor structure can be controlled by depositing a dummy sidewall spacer that is resistant to the oxidizing (i.e., ashing) and wet cleaning (e.g., etchant that removes oxides) operations, followed by a removal of said dummy sidewall spacer. The low-k sidewall spacer is then deposited in the metal gate trench and dry etched to remove a portion of the low-k sidewall spacer at the bottom of the metal gate trench. A particular profile of the low-k sidewall spacer can be observed in accordance with the manufacturing operations disclosed in the present disclosure. For example, a portion of the sidewall spacer includes a tapered profile having a greater separation of the opposing sidewalls toward a top portion of the sidewall spacer. In addition, the tapered profile further includes a narrower separation of the opposing sidewalls toward a bottom of the sidewall spacer. Such particular profile of the low-k sidewall spacer could further facilitate the gate metal filling capability because a top opening of the metal gate trench is enlarged as a result of the dry etch operation removing a portion of the low-k sidewall spacer at the bottom of the metal gate trench.

The present disclosure also detailed the manufacturing operations of the semiconductor structure having the low-k sidewall spacer possessing the aforesaid effect.

In the present disclosure, a "low k" material means a material with a dielectric constant below 3.0 (e.g., preferably about 1.8 to 2.2) and a "high k" material means a material with a dielectric constant of 3.0 or higher and more preferably of greater than 5.0. In some embodiments, the low-k materials include carbon atoms in a form of compound or dopant.

In the present disclosure, proximity is a measure of distance from a tip of widest lateral separation of a source/drain recess to an extension line of the sidewall spacer-gate electrode interface at a same horizontal level.

Referring to FIG. 1, FIG. 1 is a cross sectional view of a semiconductor structure 10, in accordance with some embodiments of the present disclosure. The semiconductor structure 10 includes a semiconductor fin 100, or a protruded stripe over a semiconductor substrate (not shown). The protruded stripe, or the semiconductor fin 100, includes a long side and a short side perpendicular to the long side. In FIG. 1, a long side L of the semiconductor fin 100 is illustrated. In some embodiments, the semiconductor fin 100 is formed by photolithography processes, including forming a photoresist layer (resist) overlying the substrate, exposing the resist to a pattern, performing post-exposure bake processes, and developing the resist to form a masking element including the resist. The masking element is then used to etch recesses into the substrate, leaving the substrate protrusions. The recesses forming substrate protrusions may be etched using reactive ion etch (RIE) and/or other suitable processes. Alternatively, the protrusions may be formed by double-patterning lithography (DPL) process. DPL allows for enhanced feature (e.g., fin) density. Various DPL methodologies may be used, including double exposure (e.g., using two mask sets), forming spacers adjacent features and removing the features to provide a pattern of spacers, resist freezing, and/or other suitable processes. After the substrate protrusions are formed, silicon dioxide or other suitable dielectric is deposited and etched to form the shallow trench isolation (STI) that surround and isolate the substrate protrusions. This may be accomplished by any suitable process, which may include dry etching, wet etching, and a chemical vapor deposition process.

In FIG. 1, a metal gate 101A of a first conductivity type is over the top right of the long side of the semiconductor fin 100, and a metal gate 101B of a second conductivity type is over the top left of the long side of the semiconductor fin 100. The following description is directed to the metal gate 101A of the first conductivity type. However, people having ordinary skill in the art could appreciate that the same description could also be applied to the metal gate 101B of the second conductivity type. A sidewall spacer 103 is laterally surrounding the metal gate 101A. In more detail, the sidewall spacer 103 is surrounding the gate electrode portion of the metal gate 101A. The gate electrode may be composed of any appropriate conducting material, such as polycrystalline silicon or metal such as aluminum and tungsten. In some embodiments, the sidewall spacer 103 is composed of low-k dielectric.

Figure 2:
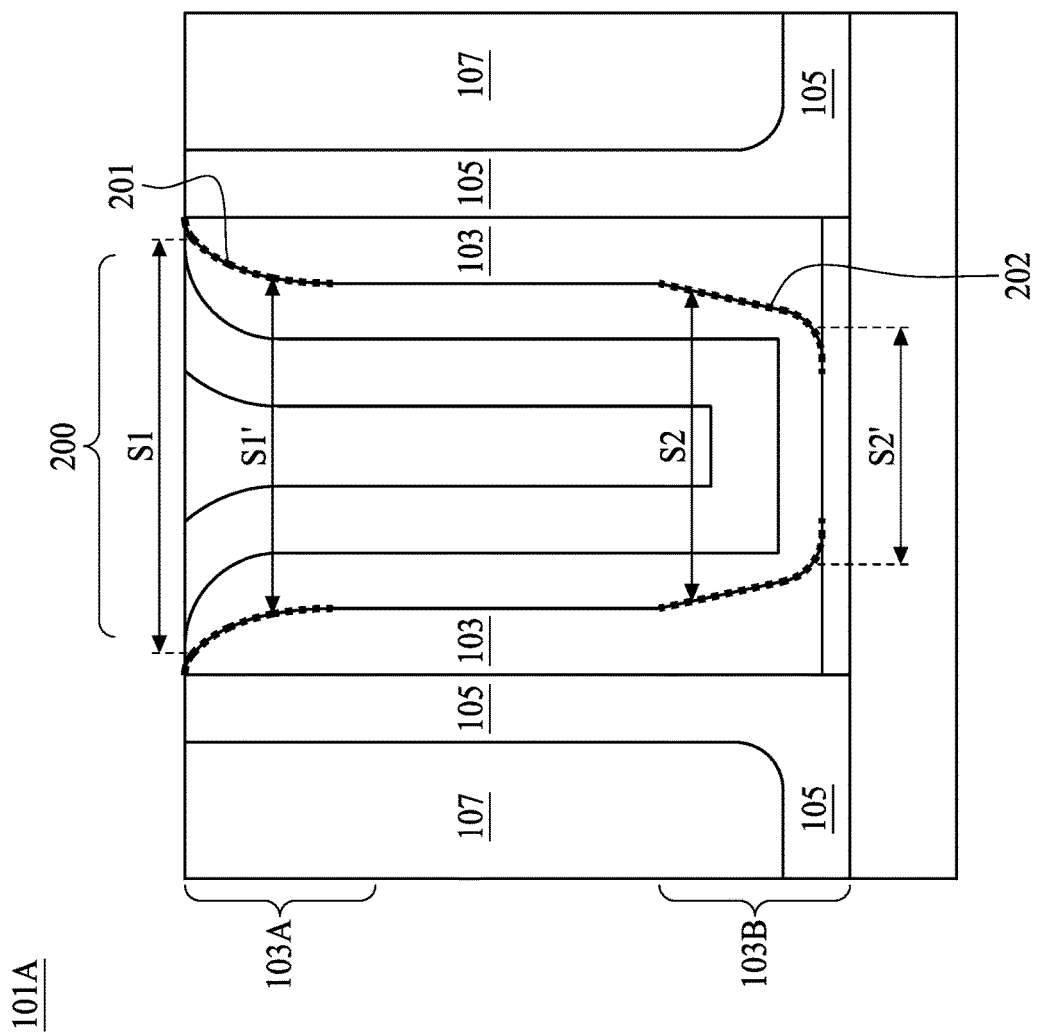
FIG. 2 is a regional enlarged cross sectional view of a semiconductor structure, in accordance with some embodiments of the present disclosure.

The profile of the low-k sidewall spacer 103 surrounding the metal gate 101A is further described below and enlarged in FIG. 2. The low-k sidewall spacer 103 is illustrated to have a tapered profile. The tapering feature can be observed in a top portion 103A of the low-k sidewall spacer. As shown in FIG. 2, in the top portion 103A of the low-k sidewall spacer, a separation S1 between the opposing sidewalls of the sidewall spacer is greater than a separation S1' between the opposing sidewalls of the sidewall spacer. The top portion 103A of the low-k sidewall spacer 103 refers to the region closer to the top or the opening of the metal gate 101A. Moreover, in the bottom portion 103B of the low-k sidewall spacer, a separation S2 between the opposing sidewalls of the sidewall spacer is greater than a separation S2' between the opposing sidewalls of the sidewall spacer. The bottom portion 103B of the low-k sidewall spacer 103 refers to the region closer to the bottom of the metal gate 101A or closer to the semiconductor fin 100.

The tapering feature of the low-k sidewall spacer 103 can also be described as a separation S1 between the opposing sidewalls of the sidewall spacer is greater than separations S2 or S2' between the opposing sidewalls of the sidewall spacer, a separation S1' between the opposing sidewalls of the sidewall spacer is greater than separations S2 or S2' between the opposing sidewalls of the sidewall spacer. In a more visual perspective, a trumpet shape can be observed in proximity to the top portion 103A of the sidewall spacer 103, whereas a footing can be observed in proximity to the bottom portion 103B of the sidewall spacer 103.

Further illustrated in FIG. 2, the profiles of a trumpet shape and a footing is further discussed. In the top portion 103A, the sidewall spacer 103 possesses a convex boundary 201 interfacing with the gate electrode 200. Such convex boundary 201 is a geometrical feature of the trumpet shape described herein. In the bottom portion 103B, the sidewall spacer 103 possesses a concave boundary 202 interfacing with the gate electrode 200. Such concave boundary 202 is a geometrical feature of the footing described herein. The gate electrode are composed of conductive materials including work function metal layer, TiN/TaN layer, conductive metal such as Al, Cu, W, Ti, or the combinations thereof.

Referring to FIG. 1 and FIG. 2, the sidewall spacer 103 is further surrounded by an etch stop layer 105 and interlayer dielectric 107. In some embodiments, the etch stop layer 105 is composed of materials different from those constituting the sidewall spacer 103. For example, materials of the etch stop layer 105 is not low-k dielectric whereas sidewall spacer 103 is composed of low-k dielectric. For another example, materials of the etch stop layer 105 does not contain carbon atoms whereas sidewall spacer 103 contains carbon atoms. In some embodiments, the etch stop layer 105 and the sidewall spacer 103 may composed of same materials. However, in order to decrease the capacitance between the gate electrode and the drain or between the gate electrode and the source, all the dielectric material disposed in-between can be low-k materials.

Figure 3:
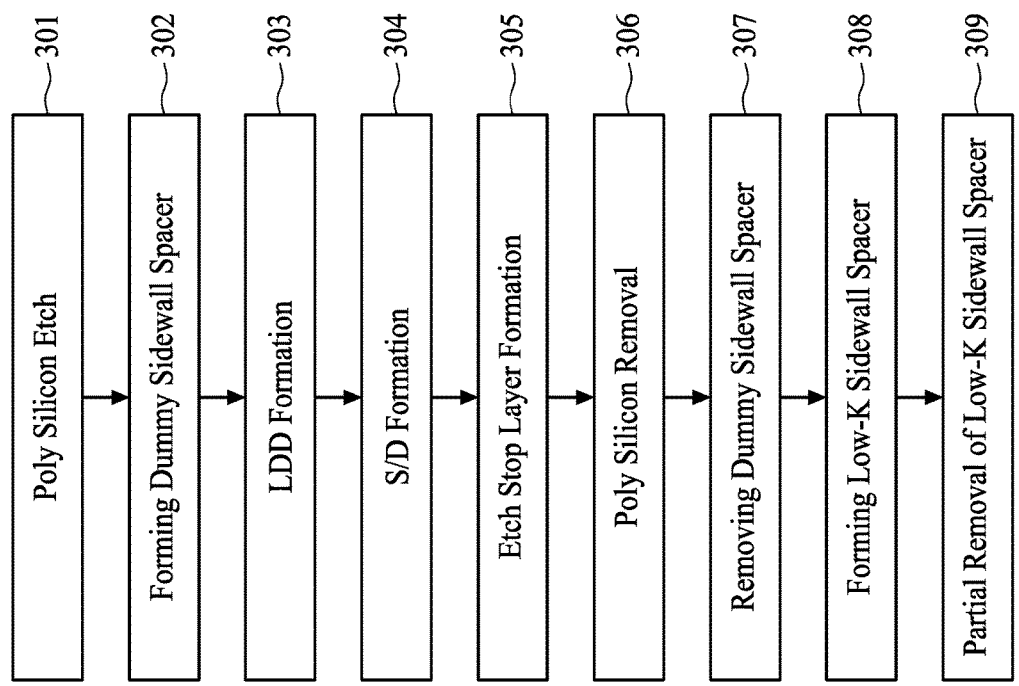
FIG. 3 is a manufacturing operation flow of a semiconductor structure, in accordance with some embodiments of the present disclosure.

Referring to FIG. 3, FIG. 3 is a manufacturing operation flow 30 of a semiconductor structure, in accordance with some embodiments of the present disclosure. The manufacturing operation flow 30 is a high-level flowchart showing the operations that are to be described below in association with FIGS. 4A to 4M.

Figure 4A:
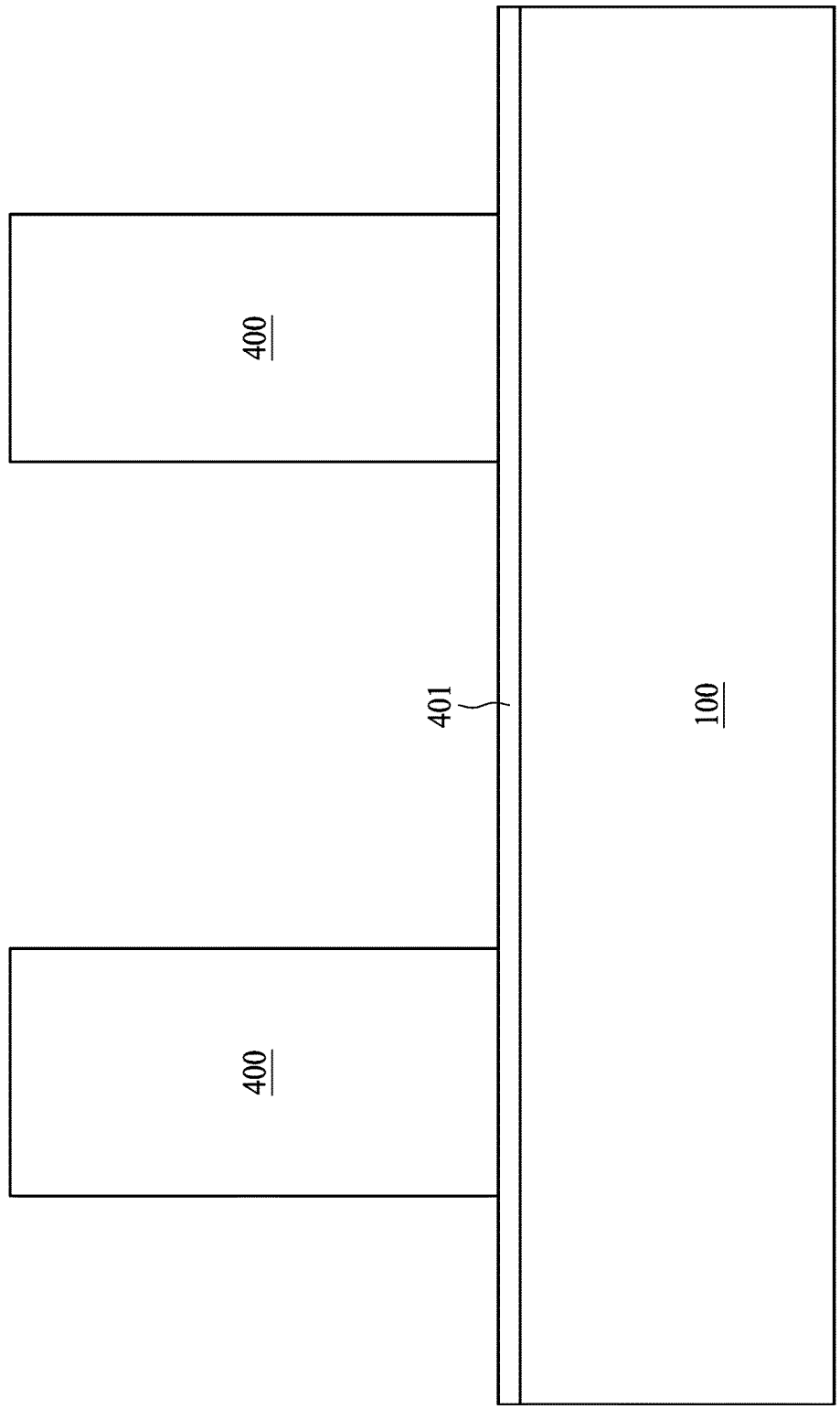
FIGS. 4A to FIG. 4M are fragmental cross sectional views of a manufacturing operation flows of a semiconductor structure, in accordance with some embodiments of the present disclosure.

Operation 301 and FIG. 4A begin with the formation of a semiconductor fin 100 protruding from a semiconductor substrate (not shown) and the formation of dummy polysilicon stripes 400 over the semiconductor fin 100. Semiconductor substrate comprises wafer, which is formed from a single crystalline silicon material. Semiconductor substrate may comprise other suitable materials or layers without departing from the scope of the present invention. For example, semiconductor substrate may include an epitaxial layer, a recrystallized semiconductor material, a polycrystalline semiconductor material or any other suitable semiconductor material. Semiconductor substrate may alternatively include other elementary semiconductors such as germanium, or include a compound semiconductor such as silicon carbide, gallium arsenide, indium arsenide, and indium phosphide. Alternatively, the semiconductor substrate may be a silicon-on-insulator (SOI) substrate. In such a case, the SOI substrate may be fabricated using separation by implantation of oxygen (SIMOX), wafer bonding, and/or other suitable methods.

Semiconductor fin 100 extends upwardly from the semiconductor substrate and form portions of NMOS FinFET and PMOS FinFET, respectively. Shallow trench isolation (STI) regions (not shown) surround the bottom portions of the semiconductor fin 100 and prevent electrical interference or crosstalk. The STI regions are composed of silicon oxide. Alternatively, they could be silicon nitride, silicon oxynitride, other suitable materials, and/or combinations thereof. It is understood that although two fin structures are illustrated, additional parallel fins may be formed from the semiconductor substrate in a similar manner.

Before the forming and the patterning of the dummy polysilicon stripes 400, a high-k dielectric layer 401 with a thickness in the range of about 1 to 200 Angstrom is formed over the semiconductor fin 100. The dielectric layer 401 is composed of a high-k dielectric material, $HfO_x$, and is deposited using chemical vapor deposition (CVD). The high-k material of dielectric layer 401 is deposited on all portions of the semiconductor fin 100, including the top and side portions. Alternately, dielectric layer 401 could be formed of $HfO_2$, HfSiO, HfSiON, HfTaO, HfTiO, HfZrO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, (Ba, Sr)$TiO_3$ (BST), $Al_2O_3$, $Si_3N_4$, oxynitrides, other suitable high-k dielectric materials, and/or combinations thereof. Next, a barrier layer (not shown) of TiN is deposited by CVD over the dielectric layer 401 to a thickness in a range of about 5 to 1000 Angstrom. A polysilicon layer is then formed by CVD over the barrier layer. The polysilicon layer is deposited to a thickness in a range of about 50 to 200 Angstrom. The polysilicon layer may each alternatively be formed using any other suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof Also, a photoresist layer is deposited over the polysilicon layer and patterned in a known manner to leave polysilicon stripes 400 over the semiconductor fin 100.

Figure 4B:
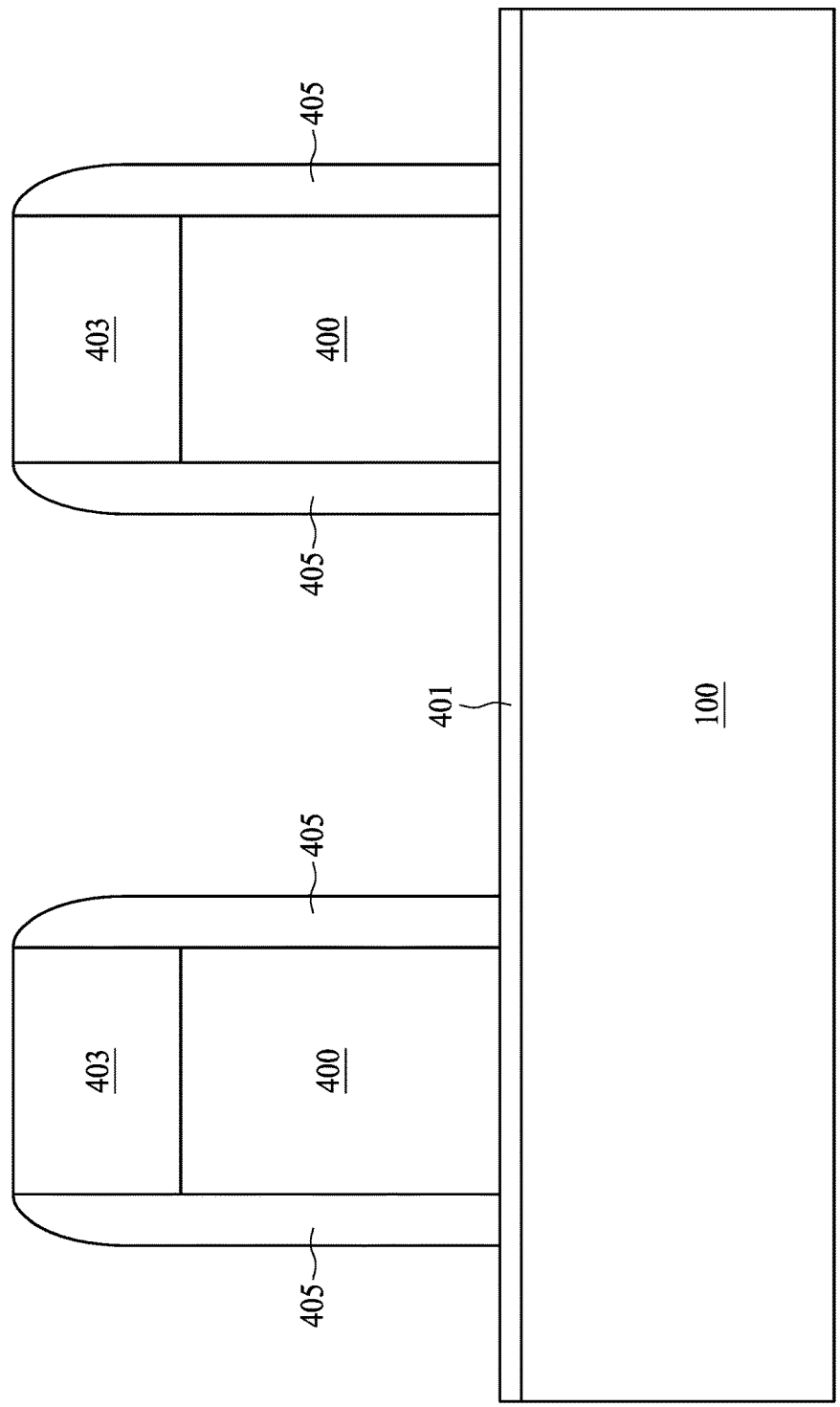

Operation 302 and FIG. 4B illustrate the formation of a sidewall spacer 405 surrounding the semiconductor stripes 400. In some embodiments, a hardmask layer 403 is formed over the top surface of the semiconductor stripes 400, followed by the formation of the sidewall spacer 405. In some embodiments, the sidewall spacer 405 is a dummy sidewall spacer that is to be removed in subsequent operations. The dummy sidewall spacer 405 formed in the present operation is resistant to photolithography operations such as ashing and fluoride-containing wet etching. For example, the dummy sidewall spacer 405 does not include low-k materials or carbon-containing dielectric. In some embodiments, the dummy sidewall spacer 405 is composed of nitride materials such as silicon nitride or the like. In some embodiments, dummy sidewall spacer 405 may be composed of materials other than nitrides, as long as the materials possess a sufficient etch selectivity with respect to the etch stop layer later described in FIG. 4F.

Figure 4C:
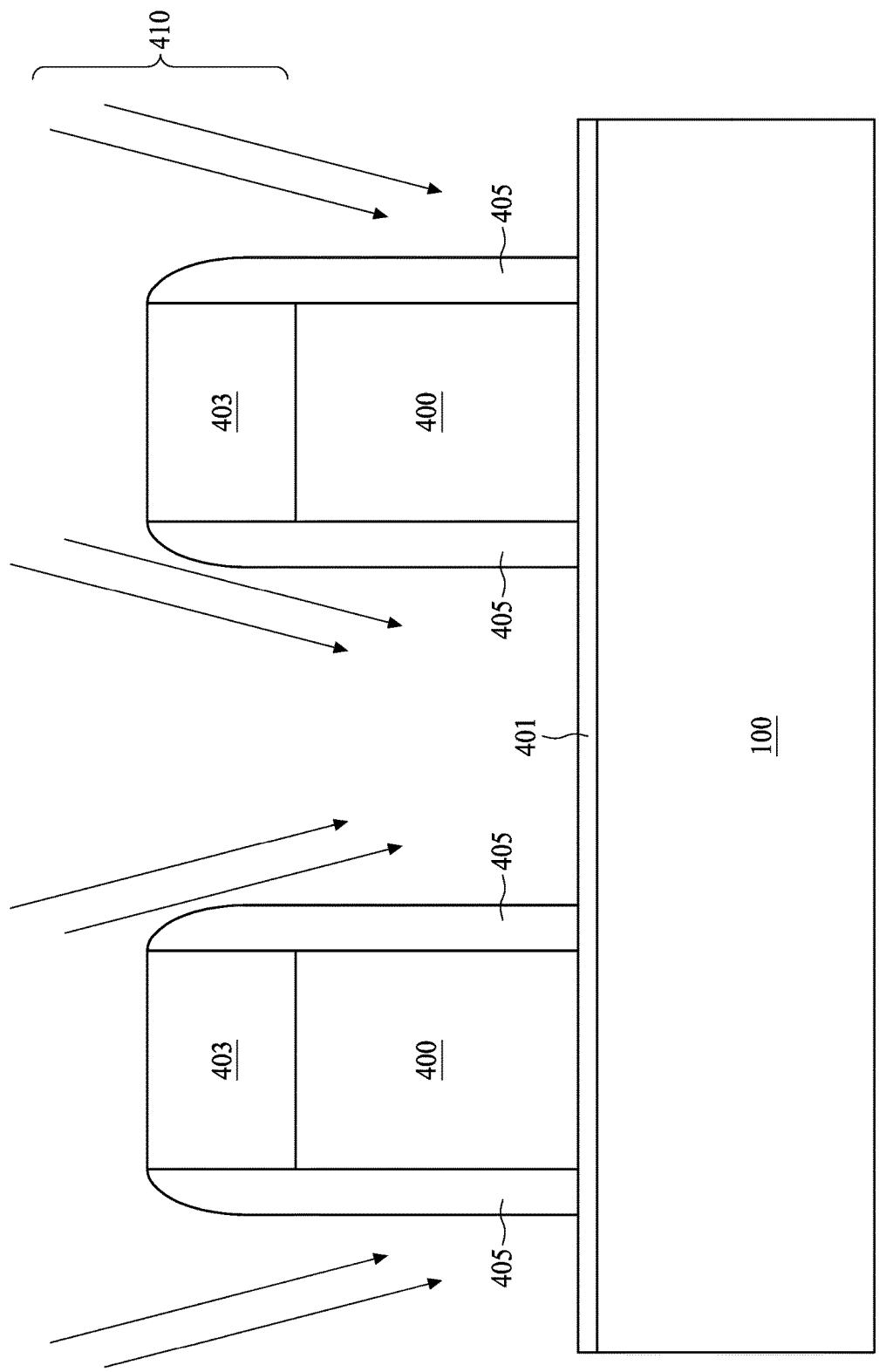
Figure 4D:
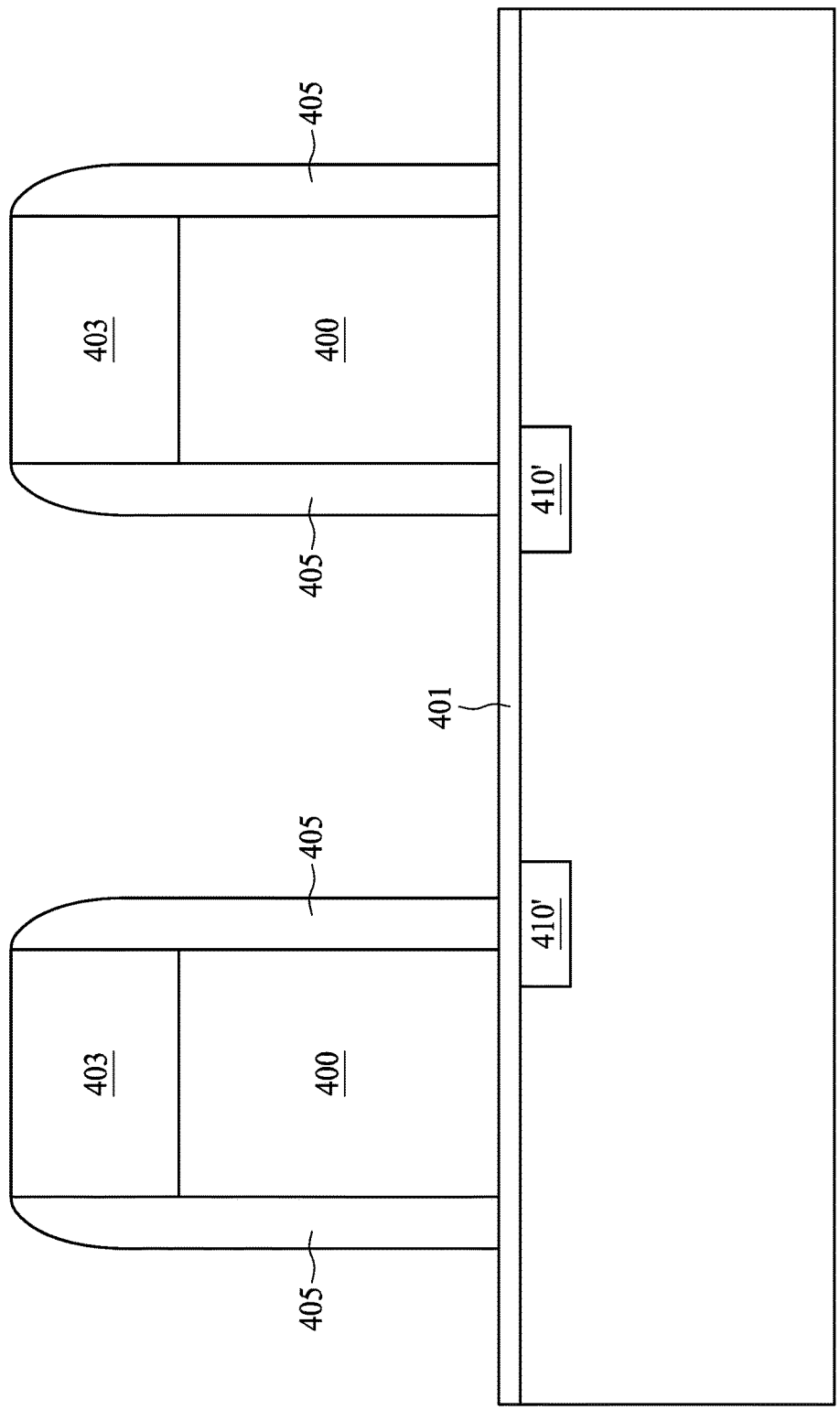

Operation 303 and FIGS. 4C, 4D illustrate a lightly doped region or so called lightly doped drain (LDD) formation by applying an ion implantation 410. After photoresist patterning, the exposed region (or the LDD-to-be region) of the semiconductor fin 100 receives high energy ion implantation. In some embodiments, the polysilicon stripes 400 and the dummy sidewall spacer 405 surrounding the polysilicon stripes 400 can be the hardmask of the LDD implantation operation so as to define the channel length of the transistor. N-type or P-type dopants are implanted into the designated region of the fin structure 100 to form LDD regions 410' abutting the bottom corner of the polysilicon stripes 400. During the ion implantation, high energy beams bombard not only the exposed semiconductor fin 100 but also the dummy sidewall spacer 405 previously formed and causing a damaged surface of such dummy sidewall spacer 405.

The photoresist removal upon the completion of the LDD formation entails an oxidation operation (e.g., ashing) and a descum operation (e.g., fluoride-containing wet etching). Since the dummy sidewall spacer 405 is resistant to the ashing and the fluoride-containing wet etching operations, the thickness of the dummy sidewall spacer 405 is not changed after the ashing and the fluoride-containing wet etching operations. Alternatively stated, the critical dimension of the gate structure is maintained as originally designed irrespective of the impact of the ion implantation operation, the ashing operation, and the fluoride-containing wet etching operation.

Figure 4E:
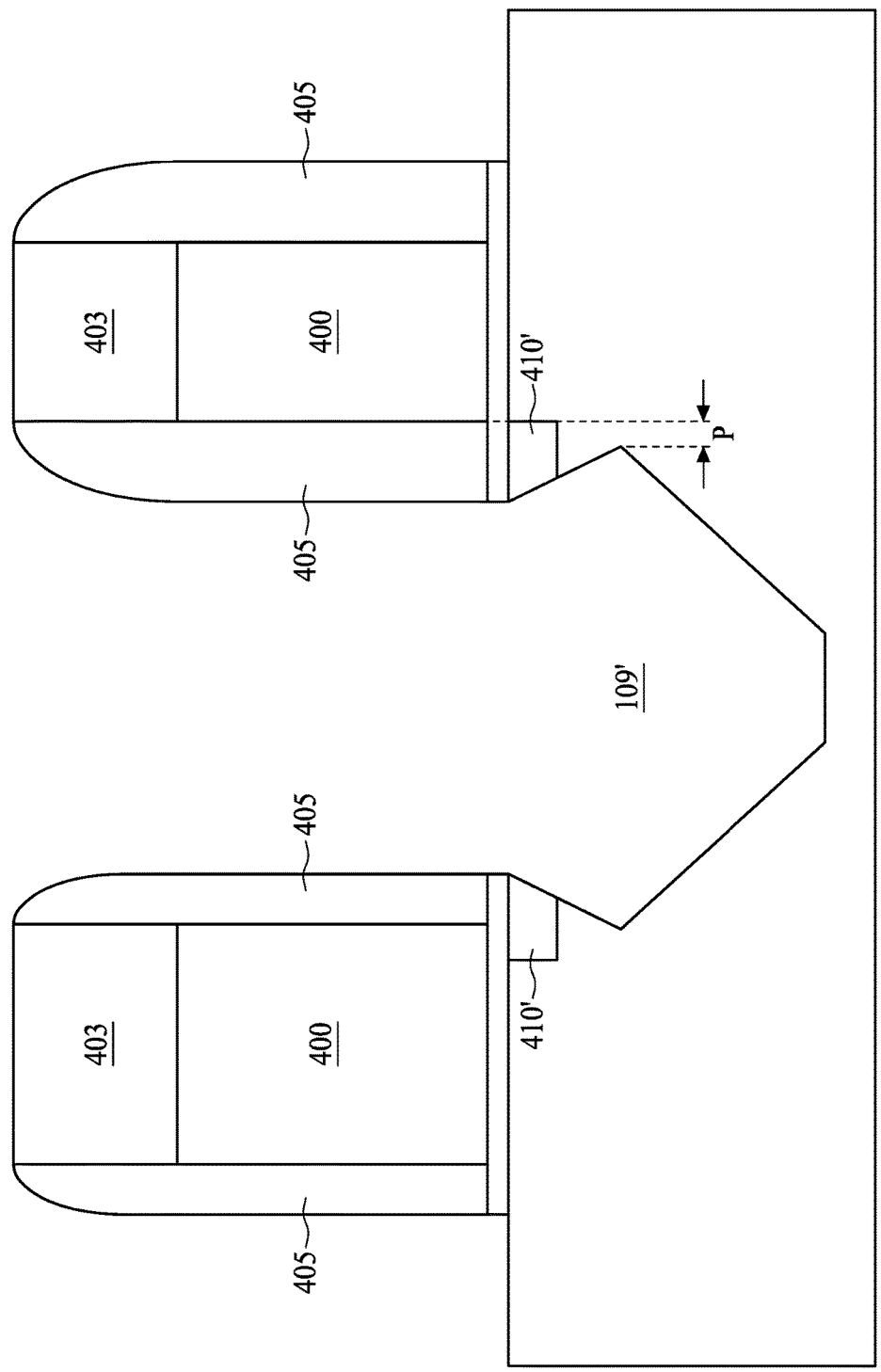

Operation 304 and FIG. 4E illustrate the formation of raised source and raised drain regions between adjacent polysilicon stripes 400. The raised source and raised drain regions are formed with first removing a portion of the semiconductor fin 100 and then epitaxially regrow the semiconductor materials into a trench 109' resulted from the removal operation. In sonic embodiments, the source and drain regions each include portions of the epitaxial Si growths that extend above the STI regions, and portions of semiconductor fin 100. These source and drain regions are doped regions having a dopant implanted therein that is appropriate for the design requirements of the FinFET. In a case which the semiconductor fin 100 is part of an NMOS device, source and drain regions are doped with an n-type dopant such as phosphorus or arsenic, or combinations thereof. In a case which the semiconductor fin 100 is part of a PMOS device so source and drain regions are doped with a p-type dopant such as boron or $BF_2$ or combinations thereof.

The proximity P of the trench 109' is in line with the original designed value as a result of the consistency of the critical dimension of the gate structure. Using the oxygen- and acid-resistant materials as sidewall spacer 405', exposure of the semiconductor fin 100 between the sidewall spacer 405' of adjacent semiconductor stripes 400 is substantially the same before and after the ashing and descum operations. The proximity P of the trench 109' would further affect the volume and location of the regrown semiconductor materials and the performance of the transistor device.

In some embodiments, epitaxial silicon is grown on semiconductor fin 100 on opposite sides of the gate structure. The epitaxial growth processes include CVD deposition techniques (e.g., vapor-phase epitaxy (VPE) and/or ultra-high vacuum CVD (UHV-CVD)), molecular beam epitaxy, and/or other suitable processes. The epitaxial process may further use gaseous and/or liquid precursors, which interact with the composition of the semiconductor fin 100 (e.g., silicon). The channel region is disposed between epitaxial growths and, as the epitaxial Si is grown, tensile strain is induced in the channel region due to lattice mismatch. Alternatively, carbon-containing epitaxial silicon (Si:C) may be grown instead of epitaxial silicon. The semiconductor fin 100 and newly-formed epitaxial silicon are then doped with n-type dopants, such as phosphorous or arsenic, to form the source and drain regions 109 as far as an NMOS FinFET is concerned. Next, epitaxial growth is employed to form epitaxial silicon germanium in the trench 109' in semiconductor tin 100. The channel region is disposed between the trenches 109' and, as the epitaxial SiGe is grown in the trench 109', compression strain is induced in the channel region due to lattice mismatch. The epitaxial SiGe are then doped with p-type dopants, such as boron, to form source and drain regions 109 as far as a PMOS FinFET is concerned. Optionally, other source and drain regions 109, such as lightly doped drain (LDD) as previously discussed and/or highly doped drain (HDD) regions, may be formed in the semiconductor fin 100 prior to forming the source and drain regions 109. Additionally, during this stage of processing, hard mask layers 403 are formed on top of the polysilicon stripes 400. The hard mask layer 403 can be silicon nitride in the present embodiment but alternatively may be silicon oxynitride, silicon carbide, or other suitable material.

Figure 4F:
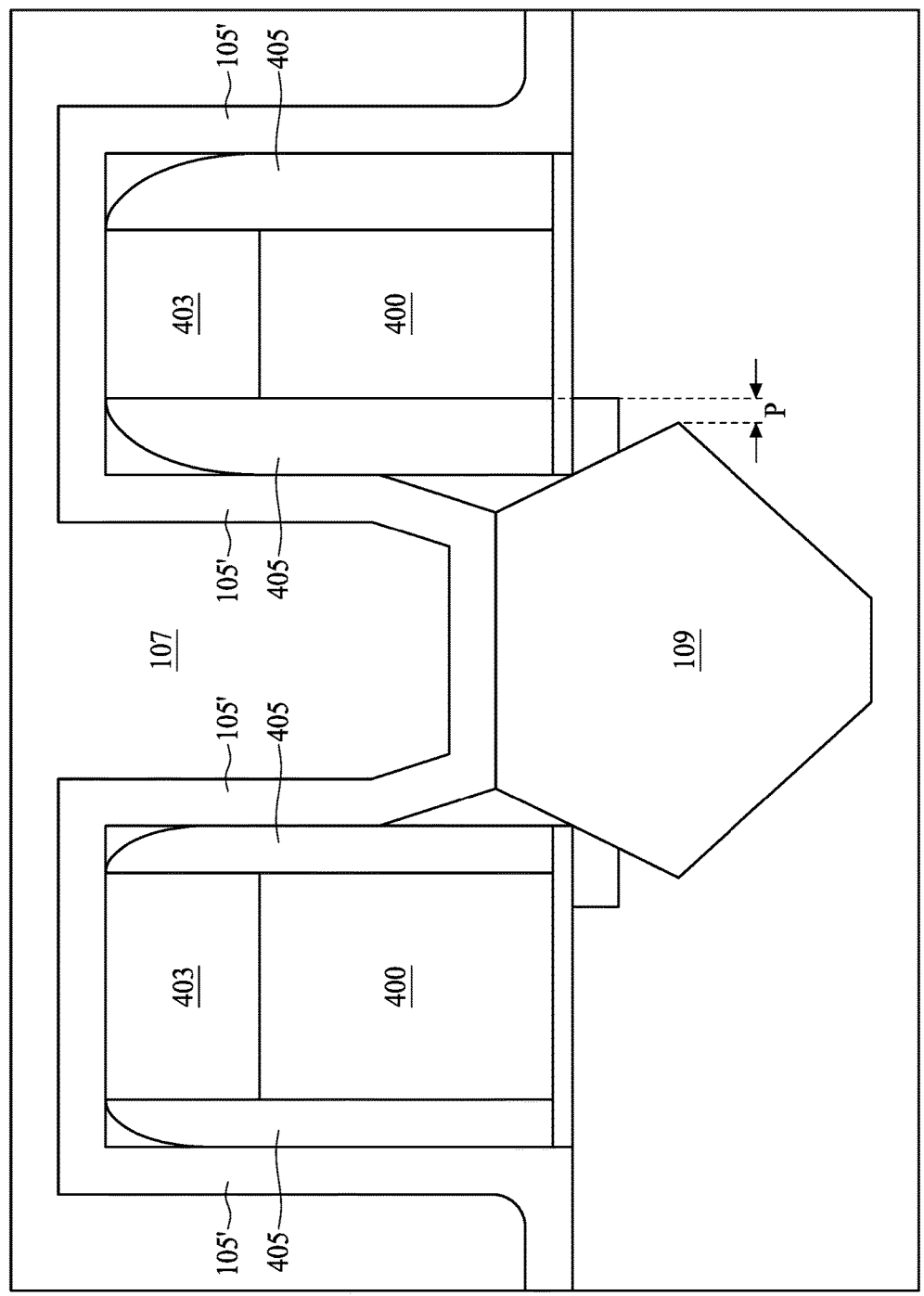
Figure 4G:
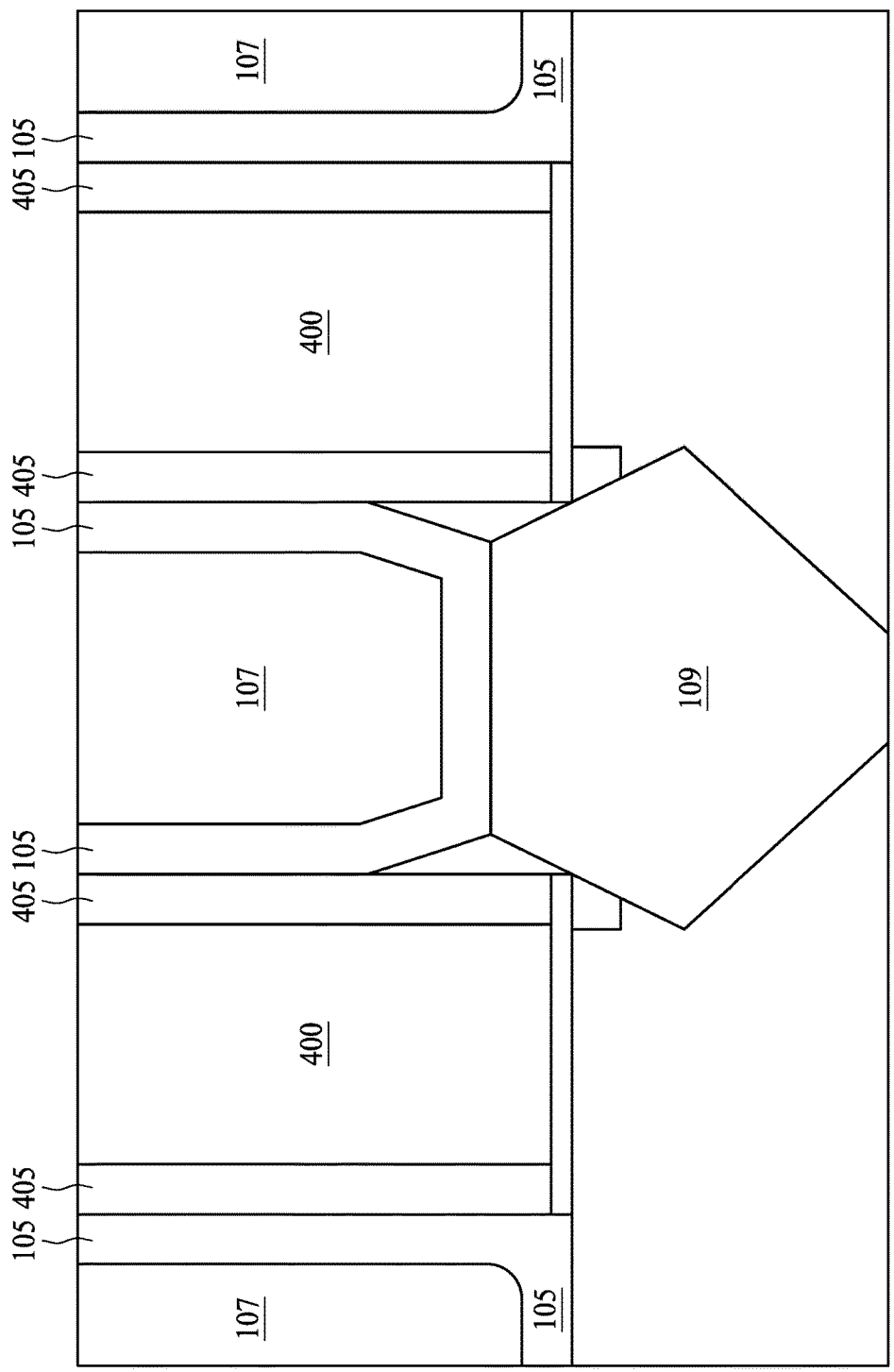

Operation 305 and FIGS. 4F, 4G illustrate the formation of an etch stop layer 105' surrounding the dummy sidewall spacer 405. The etch stop layer 105' is conformity deposited over the dummy sidewall spacer 405, the top of the source and drain regions 109, and the hardmask layer 403. In some embodiments, the etch stop layer 105' is formed by atomic layer deposition (ALD) for better thickness control. In the case where the dummy sidewall spacer 405 is composed of nitride materials, the etch stop layer 105' is composed of carbonitride. However, the materials for the dummy sidewall spacer 405 and the etch stop layer 105' are not limited thereto. The aforesaid materials can be determined as long as the etching selectivity between the dummy sidewall spacer 405 and the etch stop layer 105' is greater than 10. Alternatively, in the case where the etch stop layer 105' is composed of nitride materials, the dummy sidewall spacer 405 can be selected from the materials which possess an etching selectivity 10 times greater than the nitride materials.

An interlayer (or inter-level) dielectric (ILD) 107 is next formed over the semiconductor device, including polysilicon stripes 400 and semiconductor fin 100. The ILD 107 is composed of a dielectric such as silicon oxide or doped silicon oxide. Subsequent to the deposition of the LLD 107, a chemical mechanical polishing (CMP) process is performed, as shown in FIG. 4G, until a top surface of polysilicon stripes 400 is exposed.

Figure 4H:
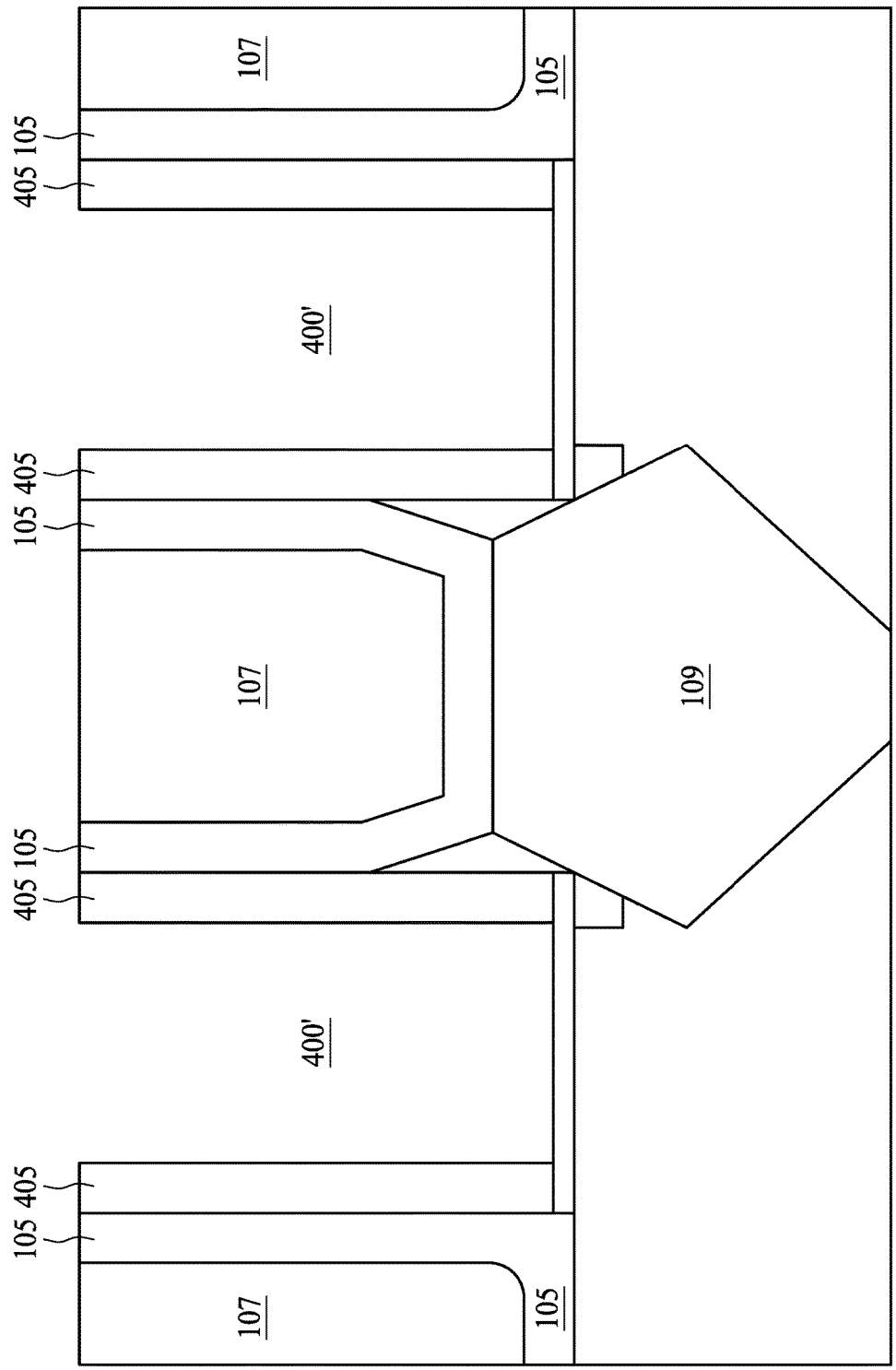

Operation 306 and FIG. 4H illustrate the removal of polysilicon stripes 400 and the formation of gate trench 400'. In some embodiments, a gate replacement process is performed, wherein the polysilicon stripes 400 are removed and replaced with a metal gate electrode. A photoresist layer protects the gate structure during this removal of the dummy polysilicon stripes 400. The dummy polysilicon stripes 400 may be removed from the gate structure simultaneously or independently by any suitable process, such as a dry etching and/or wet etching process. After etching away the polysilicon stripes 400, the photoresist is removed and descum operation may be applied. Subsequently, the gate trench 400' is formed, exposing the low-k sidewall spacer 405 and the high-k dielectric 401 at the sidewall and the bottom of the gate trench 400', respectively.

Figure 4I:
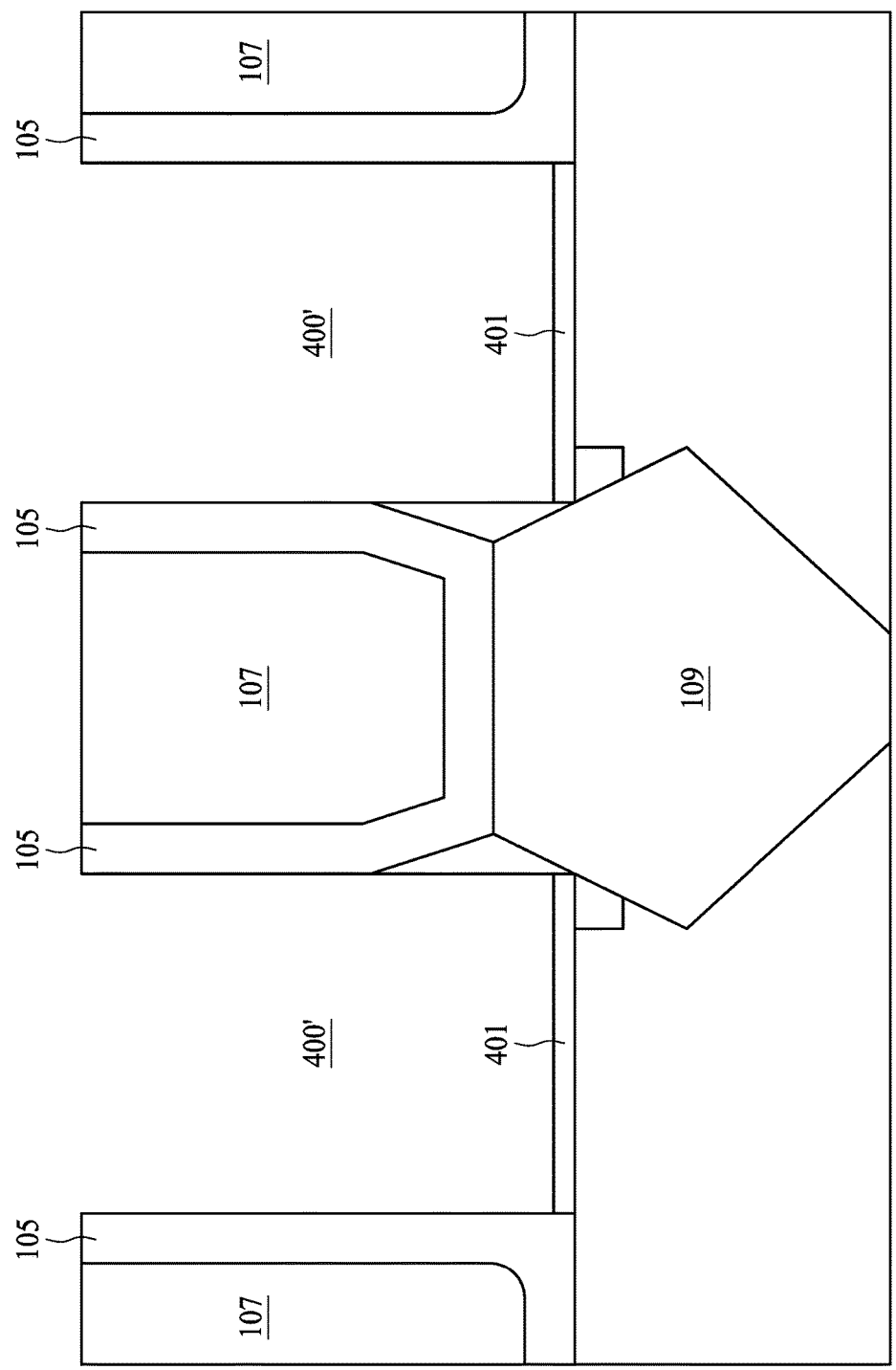

Operation 307 and FIG. 4I illustrate the removal of the dummy sidewall spacer 405 until the exposure of the etch stop layer 105. In a case where the low-k sidewall spacer 405 is composed of nitride materials, the etch stop layer 105 can be composed of carbonitride materials or oxide materials. In some embodiments, wet etchant containing phosphoric acid is applied to remove the nitride materials at a rate greater than that to the carbonitride materials. In this connection, the low-k sidewall spacer 405 is removed without affecting the thickness of the etch stop layer 105. For example, The structural integrity of the etch stop layer 105 after the removal of the low-k sidewall spacer 405 is to maintain the critical dimension of the gate structure in order to achieve the desired device performance.

Figure 4J:
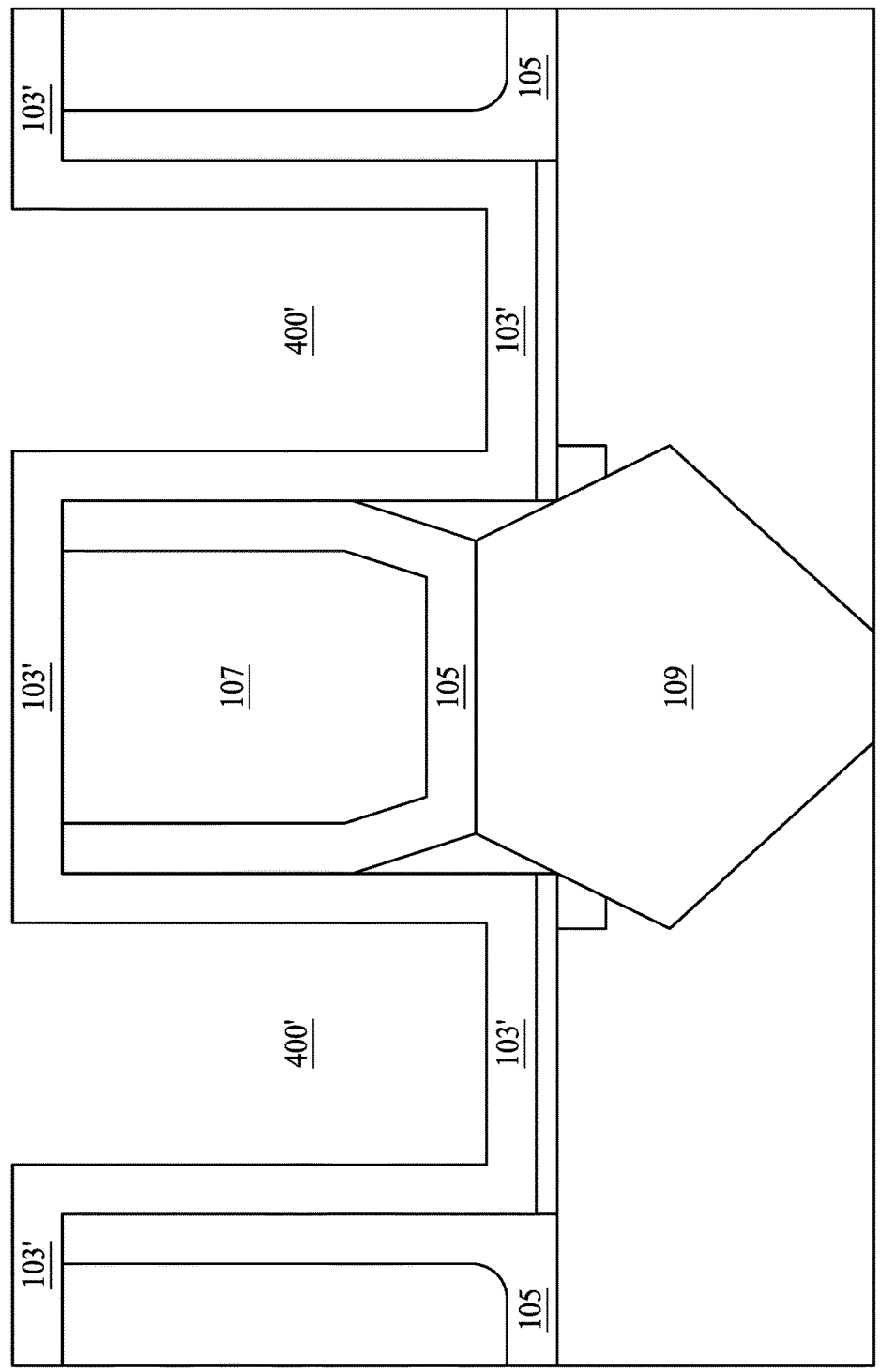

Operation 308 and FIG. 4J illustrate the formation of low-k sidewall spacer 103' over the gate trench 400', including the sidewall and the bottom of the gate trench 400', as well as the top of the etch stop layer 105 and the ILD 107. Low-k sidewall spacer 101 is conformally formed over the sidewalls and bottom of the gate trench 400' and in contact with the exposed etch stop layer 105 at least at the sidewall of the gate trench 400'. Low-k sidewall spacer 103' may be formed by any of a variety of techniques well known to those skilled in the art. In the illustrated embodiment, Low-k sidewall spacer 103' is formed by depositing carbon-containing low-k material, for example, SiOCN, upon underlying semiconductor structure. As stated above, low-k sidewall spacer 101 include a material with a dielectric coefficient k value less than the k value of silicon dioxide (i.e., less than approximately 4.2), such as HSQ, FSG or parylene. The low dielectric coefficient k value of low-k sidewall spacer 103' reduces the capacitance between gate electrode (not shown) and subsequently formed contacts over the source/drain regions. Since the capacitance between gate electrode and contacts is approximately ten to fifteen percent of the overall capacitance (gate-to-drain or gate-to-source capacitance) of a transistor, this reduction results in a reduction of the overall capacitance of transistor. This reduction in effect increases the switching speed and efficiency of transistor.

Figure 4K:
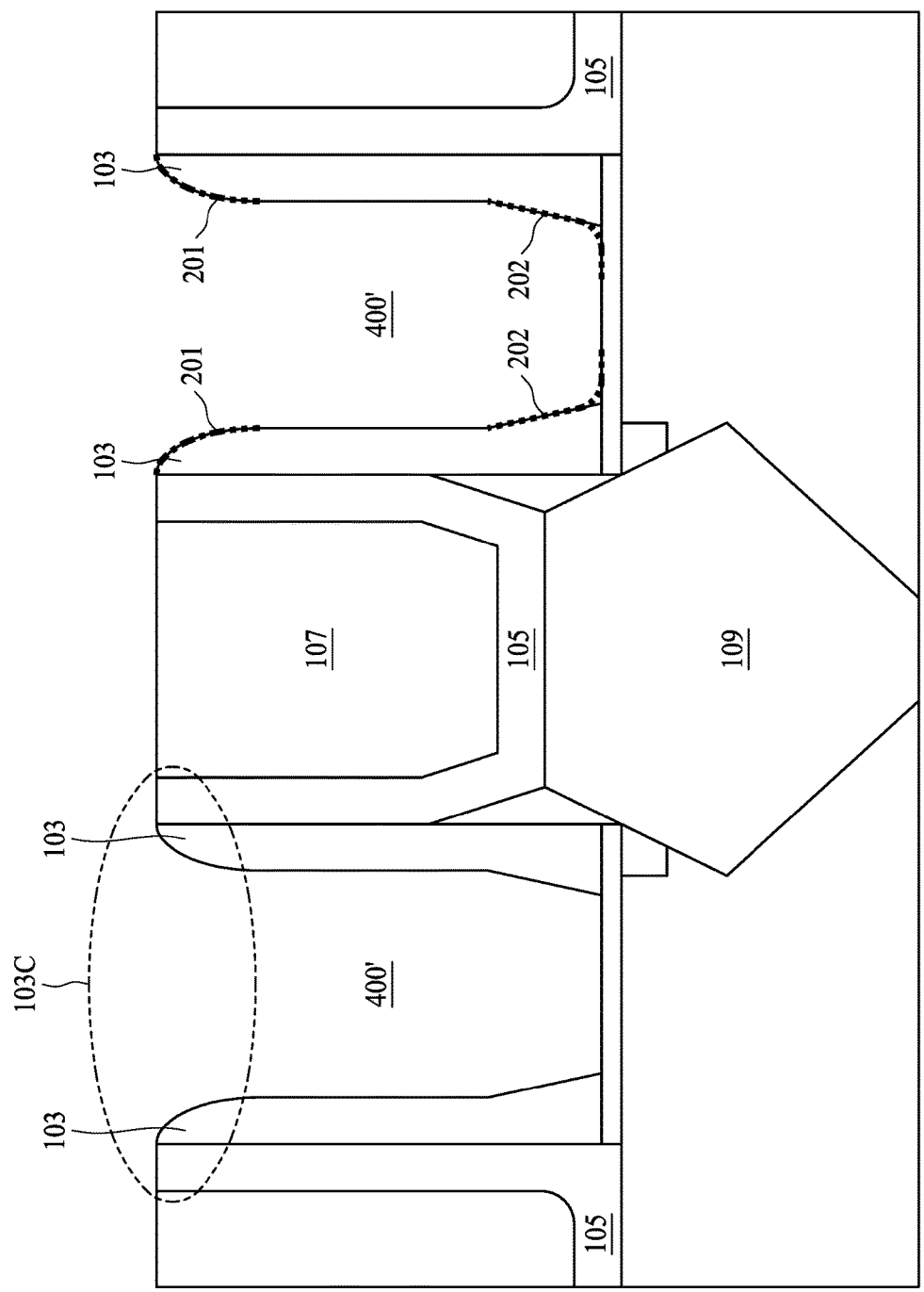

Operation 309 and FIG. 4K illustrate the partial removal of the low-k sidewall spacer 103 so as to form a low-k sidewall spacer 103 having a tapered feature at the sidewall of the gate trench as previously discussed. The deposited low-k sidewall spacer 103' is dry etched to remove the horizontal portion thereof, leaving behind the vertical portion in contact with the etch stop layer 105. The dry etch operation leaving a trace of tapering feature in the remaining low-k sidewall spacer 103. For example, a portion of the low-k sidewall spacer 103 includes a tapered profile having a greater separation of the opposing sidewalls toward a top portion of the low-k sidewall spacer 103. In addition, the tapered profile further includes a narrower separation of the opposing sidewalls toward a bottom of the low-k sidewall spacer 103. Such particular profile of the low-k sidewall spacer 103 could further facilitate the gate metal filling capability because a tapered opening 103C of the metal gate trench 400' is enlarged as a result of the dry etch operation removing a portion of the low-k sidewall spacer at the bottom of the metal gate trench. The resulting low-k sidewall spacer 103 may simultaneously possesses a profile of a trumpet shape and a footing. The trumpet shape includes a convex feature with respect to the subsequently-filled gate metal, whereas the footing includes a concave feature with respect to the same. Detailed structure of the low-k sidewall spacer 103 after the dry etch operation can be referred to the illustration and the discussion of FIG. 2.

Figure 4L:
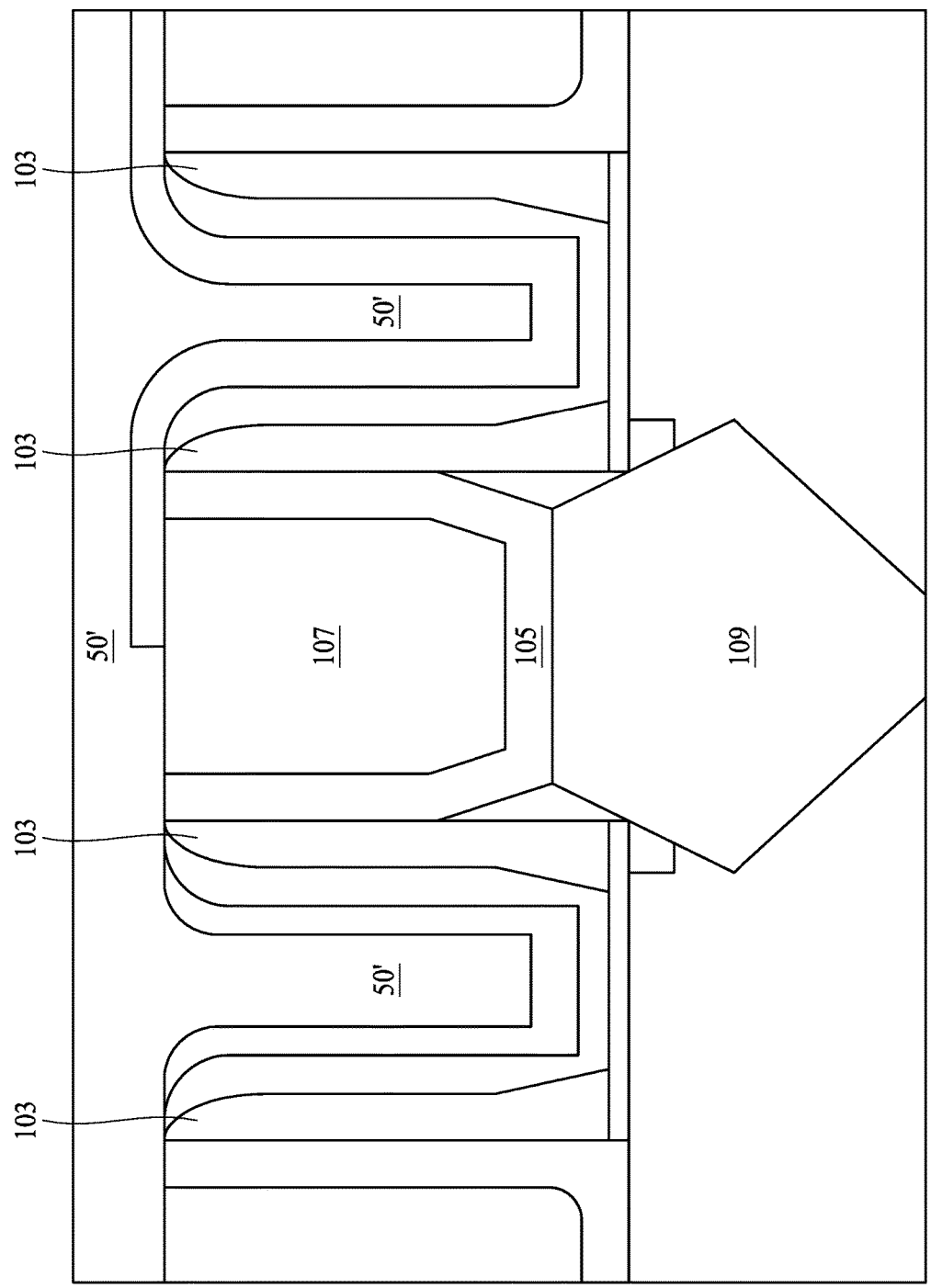
Figure 4M:
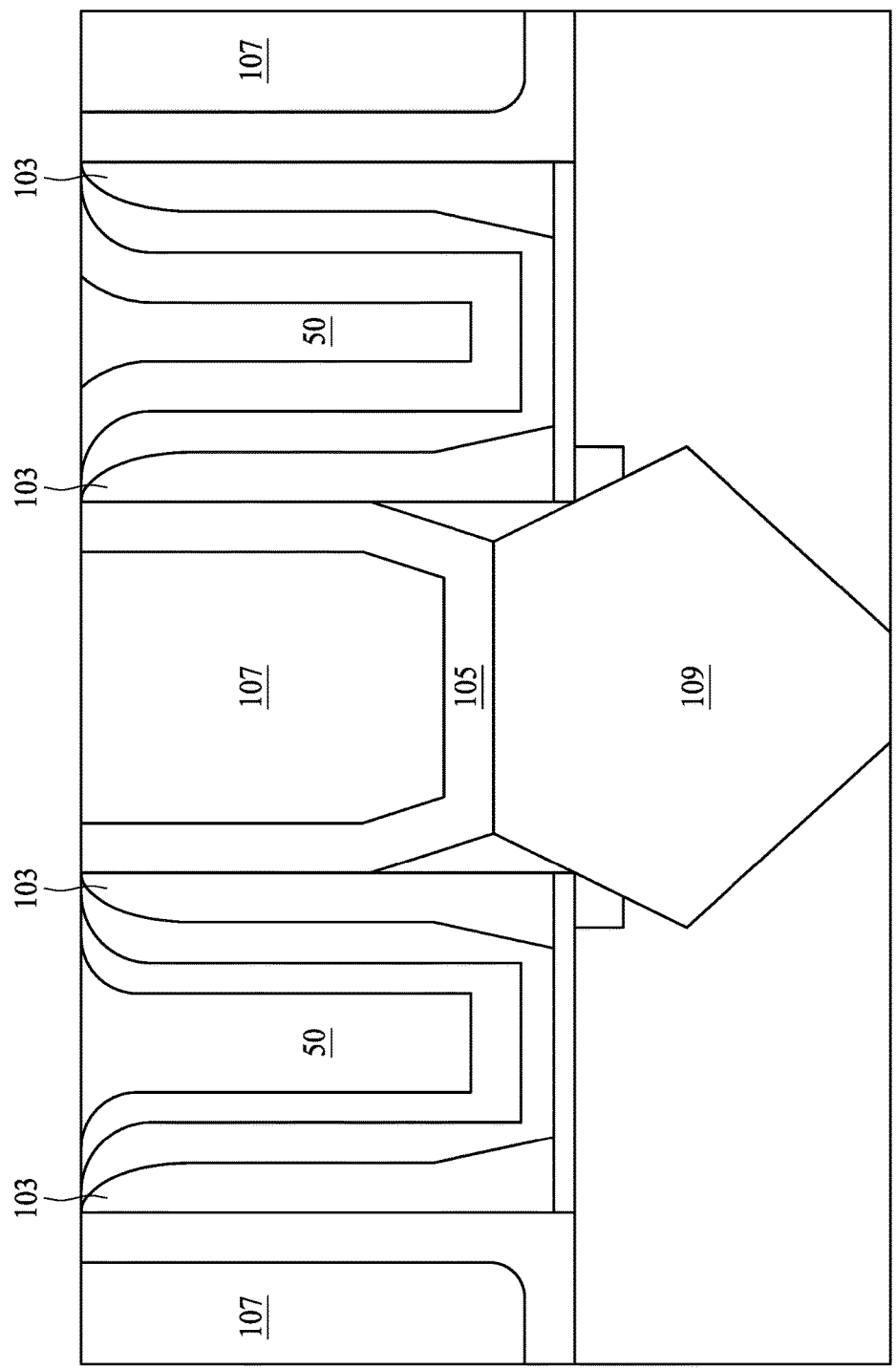

FIG. 4L and FIG. 4M illustrate the gate filling operation being applied upon the tapered opening 103C provided by the low-k sidewall spacer 103. The gate filling metal 50' is then planarized to become substantially coplanar with the top surface of the ILD 107. Filling the gate trench 400' includes depositing a work function layer and a fill metal layer, to thereby form the final gate structure. Specifically, filling the tapered opening 103C includes depositing the work function layer on the sides of the low-k sidewall spacer 103 and depositing the gate filling metal 50' in the remainder of the tapered opening 103C. In the present embodiment, the work function layer 68 is formed by the deposition of p-type work function metal (P-metal) such as TiN to a thickness in a range of about 10 Angstrom to 200 Angstrom. The gate filling metal 50' is formed by the deposition of aluminum or other conductive metal such as copper, tungsten, or titanium. Alternatively, the work function layer may include other materials such as Ru, Mo, Al, WN, or combinations thereof. Further, the work function metal may alternatively be a multi-metal layer structure with a sufficiently high effective work function (EWF) value for proper PMOS device performance. For example, the work function metal may include both a TIN layer and a TaN layer. Alternatively, the tapered opening 103C may be filled with only the gate filling metal 50', and the gate structure may be tuned to have an appropriate work function value in other known ways. Alternatively, the gate filling metal 50' may include copper, tungsten, titanium, other suitable materials, and/or combinations thereof Subsequent to the formation of the gate structure, a CMP process is performed to planarize the top portions of the gate filling metal 50' and the ILD layer 107. FIG. 4M shows the planarized gate filling metal 50 being coplanar with the etch stop layer 105 and the ILD layer 107.

It is understood that the semiconductor device 10 will undergo further processing to complete fabrication. For example, a not-illustrated multilayer interconnection (MLI) including metal layers (e.g., M1, M2, etc.) and inter-metal dielectric (IMD) will be formed above semiconductor fin 100 and gate structures in order to electrically couple various device parts to form an integrated circuit. The multilayer interconnection includes vertical interconnects, such as conventional vias or contacts, and horizontal interconnects, such as metal lines. The various interconnection features may utilize various conductive materials including copper, tungsten and silicide. In one example, a damascene process is used to form copper multilayer interconnection structure.

Figure 5:
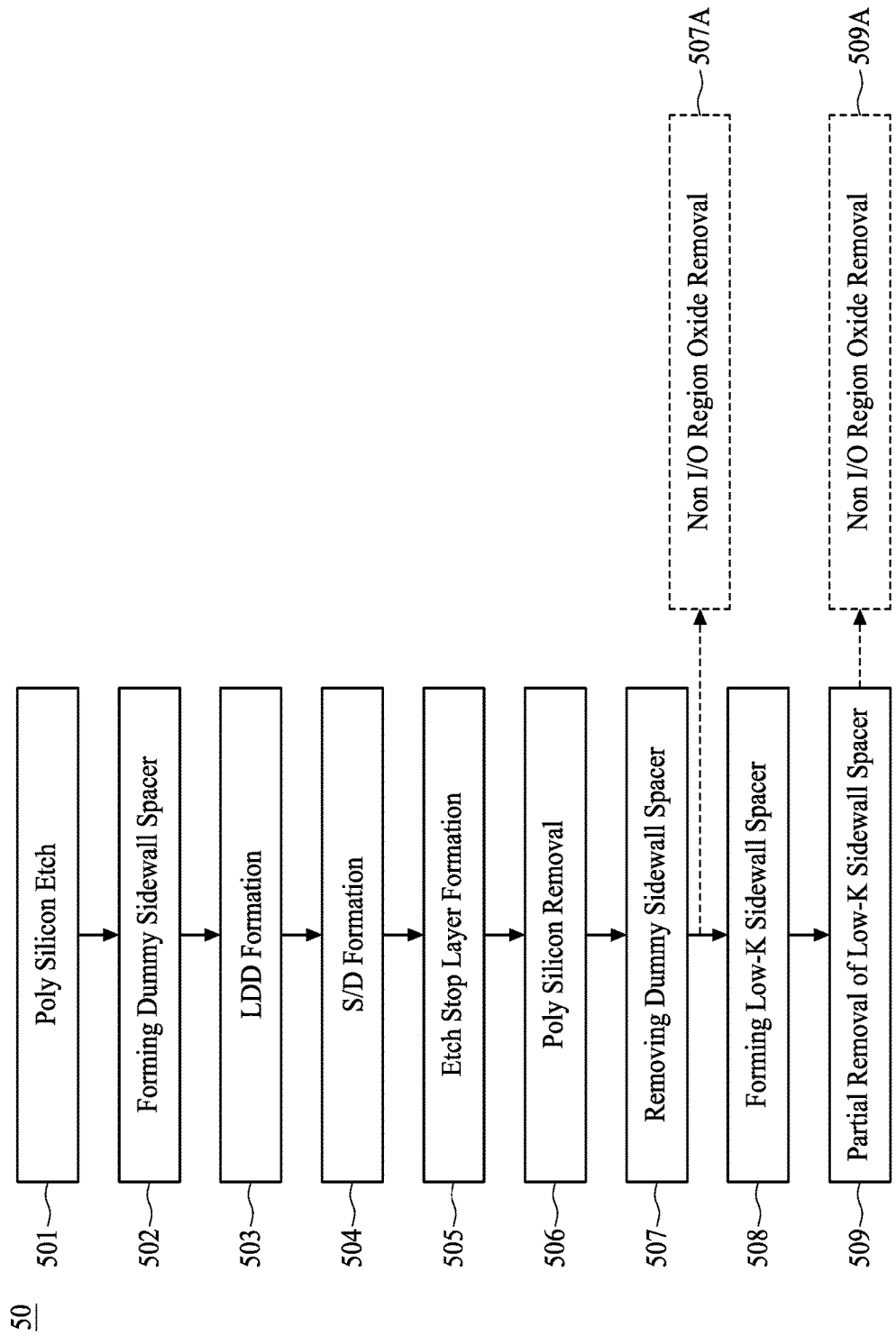
FIG. 5 is a manufacturing operation flow of a semiconductor structure, in accordance with some embodiments of the present disclosure.

Referring to FIG. 5, FIG. 5 is a manufacturing operation flow 50 of a semiconductor structure, in accordance with some embodiments of the present disclosure. The difference between the manufacturing operation flow 30 and the manufacturing operation flow 50 is that manufacturing operation flow 50 further illustrates two timings for non-I/O region oxide removal. The non-I/O region oxide removal 507A, 509A can optionally follow operation 507 or operation 509, respectively. Although other methods may be used, I/O region oxide is typically grown by oxidation in oxygen. Other oxygen compounds such as $N_2O$ and NO may be used. One exemplary I/O region oxide is silicon dioxide. I/O region oxide is generally slightly thinner than high voltage (HV) oxide layer, having a thickness between 4 and 8 nm. HV oxide layer is naturally thickened during the growth of I/O region oxide.

In sonic embodiments where the non-I/O region oxide is removed right after operation 507, the formation of low-k sidewall spacer 508 is deposited directly on the semiconductor fin 100 instead of the I/O oxide. In other embodiments where the non-I/O region oxide is removed right after operation 509 in the non-I/O region, the formation of low-k sidewall spacer 508 were to be deposited directly on the I/O oxide and the subsequent removal of the bottom of the low-k sidewall spacer 508 would involve the exposure of the underlying I/O oxide and subsequently the removal of the I/O oxide. On the other hand, in the region, the I/O region oxide is exposed subsequent to the removal of the bottom of the low-k sidewall spacer 509. A suitable annealing operation can be optionally applied to recover some of the damage made to the I/O region oxide during the operation 509, if any.

Some embodiments of the present disclosure provide a semiconductor structure, including a semiconductor fin, a metal gate over the semiconductor fin, and a sidewall spacer composed of low-k dielectric surrounding opposing sidewalls of the metal gate. A portion of the sidewall spacer includes a tapered profile with a greater separation of the opposing sidewalls toward a top portion and a narrower separation of the opposing sidewalls toward a bottom portion of the sidewall spacer.

Some embodiments of the present disclosure provide a method of manufacturing a semiconductor device. The method includes patterning polysilicon stripes over a semiconductor fin, forming a sidewall spacer of the polysilicon stripes, the sidewall spacer comprising a first material, forming a lightly doped region in the semiconductor fin; forming an etch stop layer surrounding the sidewall spacer, wherein the etch stop layer includes a second material, forming a metal gate trench by removing the polysilicon stripes, and removing the sidewall spacer by using an etchant having a greater selectivity to the first material than to the second material.

Some embodiments of the present disclosure provide a method of manufacturing a semiconductor device. The method includes forming a polysilicon stripe over a semiconductor fin, forming a nitride sidewall spacer surrounding a long side of the polysilicon stripe, forming a raised source/drain region in the semiconductor fin, the raised source/drain abutting the polysilicon stripe, and forming a carbonitride etch stop layer surrounding the nitride sidewall spacer.

Although the present invention and its advantages have been described in detail, it should be understood that various changes, substitutions and alterations can be made herein without departing from the spirit and scope of the invention as defined by the appended claims For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
   patterning polysilicon stripes over a semiconductor fin;
   forming a sidewall spacer on the polysilicon stripes;
   forming an etch stop layer surrounding the sidewall spacer;
   forming a metal gate trench by removing the polysilicon stripes;
   removing the sidewall spacer;
   forming a low-k dielectric conformally in the metal gate trench after removing the sidewall spacer, the low-k dielectric having a dielectric constant below 3; and
   removing a portion of the low-k dielectric at a bottom of the metal gate trench.

2. The method of claim 1, further comprising:
   forming a gate oxide before the formation of the polysilicon stripes;
   removing the gate oxide after the removing the portion of the low-k dielectric at the bottom of the metal gate trench.

3. The method of claim 1, further comprising:
   performing a source/drain etch between the polysilicon stripes before the forming of the etch stop layer.

4. The method of claim 1, further comprising:
   forming a lightly doped region in the semiconductor fin by patterning a photoresist over the semiconductor fin; and
   removing the photoresist by ashing and fluoride-based wet cleaning.

5. The method of claim 1, wherein the removing the polysilicon stripes comprising:
   performing a dry etch and followed by a wet etch.

6. The method of claim 1, further comprising:
   filling gaps between the polysilicon stripes with dielectric; and
   performing a chemical mechanical polishing to expose a top surface of the polysilicon stripes.

7. The method of claim 1, comprising using phosphoric acid to remove the sidewall spacer.

8. A method for manufacturing a semiconductor structure, comprising:
   forming a polysilicon stripe over a semiconductor fin;
   forming a nitride sidewall spacer surrounding a long side of the polysilicon stripe;
   forming a raised source/drain region in the semiconductor fin, abutting the polysilicon stripe; and
   forming a carbonitride etch stop layer surrounding the nitride sidewall spacer;
   removing the nitride sidewall spacer until exposing a sidewall of the carbonitride etch stop layer; and
   forming a low-k dielectric in contact with the sidewall of the exposed carbonitride etch stop layer.

9. The method of claim 8, further comprising:
   planarize the polysilicon stripe by gap filling; and
   removing the polysilicon stripe.

10. The method of claim 8, further comprising:
    removing a bottom portion of the low-k dielectric by a dry etch, thereby forming a tapered opening at a top portion of the low-k dielectric and a footing in proximity to the bottom portion of the low-k dielectric.

11. The method of claim 10, further comprising:
forming a gate oxide before the formation of the polysilicon stripe; and
removing the gate oxide after the removing the bottom portion of the low-k dielectric.

12. The method of claim 8, further comprising:
using the polysilicon stripe and the nitride sidewall spacer as a hardmask to form a lightly doped region in the semiconductor fin.

13. A method for manufacturing a semiconductor structure, comprising:
forming a polysilicon stripe over and orthogonal to a semiconductor fin;
forming a sidewall spacer of a first material surrounding a long side of the polysilicon stripe;
forming an etch stop layer of a second material surrounding the sidewall spacer, wherein the first material and the second material have different etching rates with respect to an etchant;
removing the sidewall spacer until exposure of a sidewall of the etch stop layer; and
forming a comformal low-k dielectric in contact with the sidewall of the exposed etch stop layer, the low-k dielectric having a dielectric constant below 3.

14. The method of claim 13, further comprising:
removing a bottom portion of the low-k dielectric by a dry etch, thereby forming a tapered opening at a top portion of the low-k dielectric and a footing in proximity to the bottom portion of the low-k dielectric.

15. The method of claim 14, further comprising:
forming a gate oxide before the formation of the polysilicon stripe; and
removing the gate oxide after the removing the bottom portion of the low-k dielectric.

16. The method of claim 13, wherein the first material comprises nitride and the second material comprises carbonitride.

17. The method of claim 13, wherein the etchant comprises phosphoric acid.

18. The method of claim 13, further comprising removing the polysilicon stripe before removing the sidewall spacer.

* * * * *